United States Patent [19]

Ordidge

[11] Patent Number: 4,714,883
[45] Date of Patent: Dec. 22, 1987

[54] METHOD AND APPARATUS FOR OBTAINING LOCALIZED NMR SPECTRA

[75] Inventor: Roger Ordidge, Eynsham, England

[73] Assignee: Oxford Research Systems Limited, Eynsham, England

[21] Appl. No.: 746,191

[22] Filed: Jun. 18, 1985

[30] Foreign Application Priority Data

Jun. 21, 1984 [GB] United Kingdom ................ 8415852
Mar. 13, 1985 [GB] United Kingdom ................ 8506457

[51] Int. Cl.$^4$ ............................................. G01R 33/20
[52] U.S. Cl. ................................................ 324/309
[58] Field of Search ........................ 324/309; 128/653

[56] References Cited

U.S. PATENT DOCUMENTS 4,520,828 6/1985 Burl et al. ...................... 324/309 X
4,535,290 8/1985 Post et al. ........................... 324/309

FOREIGN PATENT DOCUMENTS 0088970 9/1983 European Pat. Off. .
8400907 10/1985 Netherlands ..................... 128/653
2056088A 3/1981 United Kingdom .
2114756A 8/1983 United Kingdom .
2126727A 3/1984 United Kingdom .

Primary Examiner—Tom Noland
Attorney, Agent, or Firm—Cushman, Darby & Cushman

[57] ABSTRACT

A method of obtaining an NMR spectrum from a first region lying wholly within a second region of a sample material, comprises obtaining a signal indicative of a first NMR spectrum from substantially all of the second region of the sample material applying to the sample a magnetic field gradient, and simultaneously applying to the sample an Rf perturbing pulse having an amplitude and a frequency distribution such as to perturb nuclear spins in the said first region, but not outside it, removing the magnetic field gradient, and thereafter obtaining from the sample a signal indicative of a second NMR spectrum before relaxation of the perturbed spins in the said first region, and comparing the said first and second signals to obtain a difference spectrum attributable to the said region.

Three separate perturbing pulses are preferably employed, each in the presence of a corresponding field gradient. The experiment is preferably repeated a large number of times, with the Rf carrier frequency stepped between each Rf pulse (for example every 500 microseconds).

17 Claims, 10 Drawing Figures

METHOD AND APPARATUS FOR OBTAINING LOCALIZED NMR SPECTRA

BACKGROUND OF THE INVENTION

This invention relates to methods of obtaining NMR spectra from a region lying wholly within a sample, and has application, for example, in obtaining NMR spectra from within living bodies. An example of one technique for obtaining information of this kind is disclosed in U.K. Patent Application No. 8303501 (now published as No. 2,114,756). There is also disclosed in U.K. Patent Specification No. 2056088 a method of imaging a region lying within another region. However, this technique is not suitable for obtaining spectral data.

SUMMARY OF THE INVENTION

In accordance with the present invention, there is provided a method of obtaining an NMR spectrum from a first region lying wholly within a second region of a sample material, which method comprises obtaining a signal indicative of a first NMR spectrum from substantially all of the second region of the sample material, applying to the sample a magnetic field gradient, and simultaneously applying to the sample an Rf perturbing pulse having a frequency distribution such as to perturb nuclear spins in the said first region, but not outside it, removing the magnetic field gradient, and thereafter obtaining from the sample a signal indicative of a second NMR spectrum before relaxation of the perturbed spins in the said first region, and comparing the said first and second signals to obtain a difference spectrum attributable to the said region.

The Rf perturbing pulse is selective in that it has, in effect a relatively narrow frequency distribution, such as to cause perturbation of nuclear spins for the nuclei of interest only in the said first region, but not outside it. In practice, amplitude modulation of an appropriate Rf pulse is utilized, so as to produce the desired equivalent frequency distribution. The techniques of pulse shaping are well known, and are described, for example, in papers by R. J. Sutherland and J. M. S. Hutchison (J. Phys. E. Sci. Instrum., Vol 11, 1978), and by J. M. S. Hutchinson, R. J. Sutherland, and J. R. Mallard (J. Phys. E. Sci. Instrum., Vol 11, 1978).

The Rf pulse used to perturb the spins in the region is preferably of a magnitude such as to cause 180° spin nutation in the region (i.e. inversion of the spin population in the region). However any Rf pulse which will cause perturbation of spins to affect the net magnetization along the Z axis will generate a measurable dfference between the two spectra, although this difference will be maximized when a 180° Rf pulse is utilized. When the perturbing Rf pulse is a 90° pulse, it may be thought of as eliminating the net Z magnetization in the slice in question.

Utilizing the foregoing method, it is possible using a relatively simple technique to localize the area from which the NRM signal is received to a thin slice of material, the thickness of which can be controlled by controlling the magnitude of the applied field gradient, and the position of which, along the direction in which the gradient is applied, can be controlled by varying the zero-crossing point of the field gradient or by adjusting the Rf carrier frequency of the Rf pulse utilized. The orientation of the slice may be readily controlled by varying the orientation of the applied field gradient, for example by using a combination of conventional X, Y, and Z gradient coils of a conventional NMR spectrometer.

Localization of the signal region within the slice can be readily achieved by the use of a conventional so-called "surface" coil, with its plane parallel to the plane of the selected slice, either for the transmission of the Rf pulse, or connected to the receiver as the receiving antenna, or both.

By moving the surface coil in its plane, information about different regions within the selected slice can be obtained, and by varying the carrier frequency of the Rf pulse, the position of the selected plane along the direction of the applied gradient can be varied. Thus, it is possible to obtain localized information from any selected region within the sample.

The Rf pulse may be applied by any conventional means, for example using a saddle coil, or, preferably a surface coil, for example the surface coil which is used as the receiver. The NMR spectra measured with and without the pertubation of spins in the first region may be taken in either order.

The frequency envelope of the Rf pulse required to perturb or "condition" a slice of nuclear spins generally has the form of a so-called "top hat" function, that is to say it consists of a narrow band of frequencies of high intensity. Such a waveform can be produced by calculating the desired frequency distribution, and applying Fourier transform techniques to produce the appropriate amplitude modulation for the Rf pulse. This technique of pulse shaping is commonly used in nuclear magnetic resonance, and is described, for example, in the papers by R. G. Sutherland and J. M. S. Hutchison (J. Phys. E. Sci. Instrum., Vol. 11, 1978), and by J. M. S. Hutchison, R. G. Sutherland, and J. R. Mallard (J. Phys. E. Sci. Instrum, Vol. 11, 1978), mentioned above. The field gradient and Rf pulse are preferably applied for substantially the same period of time, (i.e. they will generally begin and end together) that period of time preferably being the minimum necessary to achieved the desired slice perturbation. In practice, the Rf pulse will be applied as soon as the gradient has stabilized sufficiently, and as soon as the Rf pulse has ended, the gradient will be switched off.

As indicated above, one way of varying the position of the slice along gradient direction is to vary the zero-crossing point of the applied field gradient. In an alternative and a preferred embodiment, different slices may be examined by varying the Rf carrier frequency of the selective pulse applied, so that the perturbing pulse is equivalent to an Rf pulse of varying frequency. To enable a number of slices to be examined in a reasonable time period the Rf carrier frequency is preferably stepped rapidly, for example, not less than once each 10ms, preferably every 500 $\mu$s, more preferably every 50 $\mu$s or faster. In a particularly preferred embodiment, information about several slices can be obtained by carrying out a sequence of signal acquisitions in rapid succession, using a different "conditioning" Rf pulse sequence for each acquisition. Thus, for example, a first acquisition may be made with no conditioning Rf pulse, a second with a pulse shaped to perturb only a first slice of material (slice "B"), a third with a pulse shaped to perturb only a second slice of material (slice "C"), and a fourth shaped so as to perturb both the first and second slices. The signal from slices B and C may then be obtained from the expressions $4B = (1) - (2) + (3) - (4)$ $4C = (1) + (2) - (3) - (4)$ where (1), (2), (3), and (4) represent the signals acquired in the respective signal acquisitions and B and C represent the signals from respective slices B and C which would have been produced in a single data acquisition. Thus, by appropriate differencing, the signal from any desired slice may be isolated.

It is a particular advantage using this method that the signal-to-noise ratio improvement which is achieved using the four signal acquisitions is just as good as would have been obtained if four separate identical experiments had been performed on a single slice, (i.e. the improvement in signal-to-noise ratio is 2, for four acquisitions). The principle of investigating different slices of the material by an appropriately shaped conditioning pulse sequence may be extended to observing simultaneously many more slices, without any penalty in signal-to-noise ratio. It will be apparent that, with each additional slice, the minimum number of experiments required in order to obtain the necessary difference information is doubled. Thus, eight signal acquisitions are required for three slices, and sixteen for four slices.

This technique has the advantage however that the Rf pulse sequences may readily be generated by a computer-programmed Rf generator, and similarly a computer can readily perform the differencing required on the data obtained, so as to isolate the information relating to each respective slice.

When this technique is utilized, the selective perturbation of the slices may be carried out by so shaping a single selective pre-pulse as to perturb the desired multiple planes in a single radio-frequency pulse. Alternatively, and preferably, the desired planes may be affected by a sequence of selective pulses, each so shaped as to perturb a single slice. Displacement of the effective Rf frequency of a particular pulse sequence may be produced easily in real time by alteration of the Rf carrier frequency.

The Rf pulse sequence may be applied either through a surface coil, for example the coil used as receiving antenna, or through a larger coil, encompassing the sample with a more uniform Rf distribution.

Alternatively, Rf pulses may be applied alternately through a surface coil, and a larger coil.

As indicated above, localization of the region from which the spectrum is obtained within each individual slice may be achieved by utilizing as receiver or transmitter a relatively small surface coil, and moving the surface coil around the surface of the article under investigation. In an alternative and preferred embodiment however, an experiment of sequence of experiments may be carried out as indicated above, with an applied field gradient in a first direction (for example the X direction), and a second selective Rf pulse is then applied in the presence of a field gradient in a second direction orthogonal to the first direction (for example the "Y" direction). By differencing techniques, this method enables a spectrum to be obtained from a narrow column of material in each selected plane.

If the sequence is repeated a third time, and a third selective Rf pulse applied in the presence of a magnetic field gradient applied in a third direction, orthogonal to both the first two directions, (for example the "Z" direction), it becomes possible, by further differencing, to obtain a spectrum from an area which is localized in space in three orthogonal directions (effectively, a small cube within the sample), without any physical movement of the receiver or transmitter coil over the sample.

The invention includes within its scope apparatus for obtaining an NMR spectrum from a first region lying wholly within a second region of a sample material, which apparatus comprises:

means for supporting a sample in a substantially homogeneous magnetic field, means for applying to the sample a first signal acquisition Rf pulse, and acquiring from the sample a first signal, indicative of the NMR spectrum of a said second region of the sample, means for superimposing on the magnetic field a field gradient in a first direction, means for applying to the sample in the presence of the said gradient a first Rf conditioning pulse having an amplitude and frequency distribution such as to perturb nuclear spins only in a said first region lying wholly within the said second region, means for removing the gradient and immediately thereafter applying to the sample a second signal acquisition pulse, and acquiring from the sample a second signal, indicative of the NMR spectrum of the said second region of the sample after the application of the said Rf conditioning pulse, but in the absence of applied field gradient, and means for comparing the said first and second signals, to obtain an NMR spectrum due only to a said first region, The apparatus will generally include means for repeating the sequence of Rf pulses and signal acquisition rapidly, and for averaging the signals obtained from repeated acquisitions.

As indicated above, the apparatus preferably includes means for varying the Rf carrier frequency rapidly between successive Rf pulses. The varying means is preferably capable of stepping the carrier frequency within a time period not greater than 10 milliseconds, preferably not greater than 500 microseconds, more preferably not greater than 50 microseconds.

BRIEF DESCRIPTION OF THE DRAWINGS

A preferred embodiment of the invention will now be described with reference to the accompanying drawings, in which.

DESCRIPTION OF THE PREFERRED EMBODIMENTS

Figure 8:
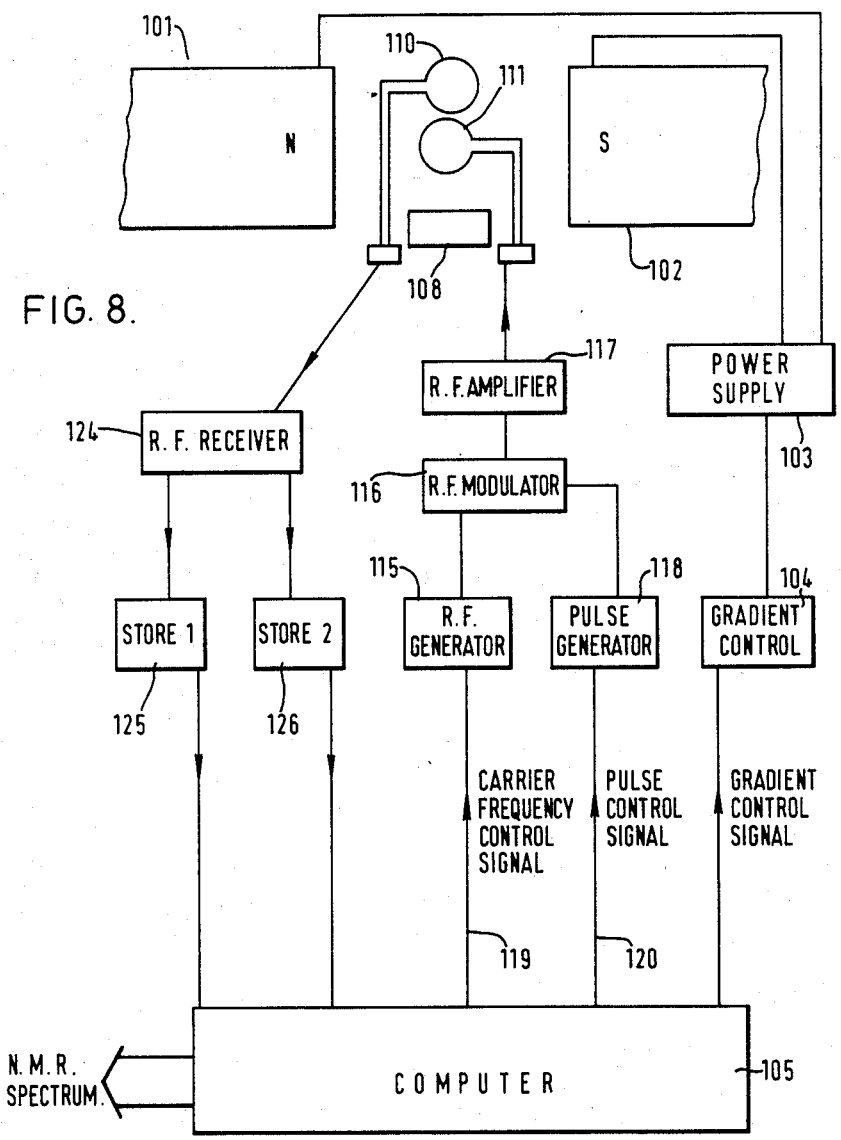
FIG. 8 illustrates schematically apparatus in accordance with the invention.

Referring first to FIG. 8, an NMR spectrometer comprises a magnet having pole pieces 101 and 102 respectively. The magnet may be of any kind capable of producing a suitably homogeneous magnetic field, for example a permanent magnet, but is preferably a superconducting magnet. The magnet may be of conventional form, and is provided with gradient coils (not shown) of substantially conventional form, to enable magnetic field gradients to be applied in three orthogonal directions. A power supply 103 provides the appropriate electric currents for the magnet and gradient coils, and a gradient control 104 enables the gradients to be applied in a controlled way. The gradient control may be operated by a computer 105, which also may be programmed to control various other functions of the apparatus, as will be described hereinafter.

The apparatus includes a sample support 108, for supporting the sample under test between the pole pieces 101 and 102. When the apparatus is utilized for obtaining information about a human patient, the patient support 108 may take the form of a chair, or like member, for supporting the patient with the desired portion of the body, for example the head, between the pole pieces 101 and 102.

The apparatus includes, in the embodiment shown, an Rf receiver coil 110, and an Rf transmitter coil 111. These are shown schematically as single loops of wire, although either may in practice be a more complex antenna structure, of any conventional form, and furthermore, both the Rf transmit and receive coils may be combined into a single antenna.

The Rf transmit coil 111 is connected to an Rf generator 115 via an Rf modulator 116 and an Rf amplifier 117. Also connected to the Rf modulator 116 is a pulse generator 118, for generating the desired pulse sequences as will be described hereinafter.

The Rf generator 115 and pulse generator 118 are connected to the computer 105 by control lines 119 and 120 respectively, so that the computer is capable of controlling the carrier frequency and pulse wave form. The Rf generator 115 is capable of shifting the carrier frequency within a time scale of approximately 300 microseconds, whilst maintaining the phase integrity of the applied Rf field.

The Rf receive coil 110 is connected to an Rf receiver 124 of generally conventional form, which can store information relating to the signal received in one of two signal stores 125 and 126. The signal stores 125 and 126 are in turn connected to the computer 105 to enable the differencing technique in accordanace with the invention to be carried out.

Figure 1A:
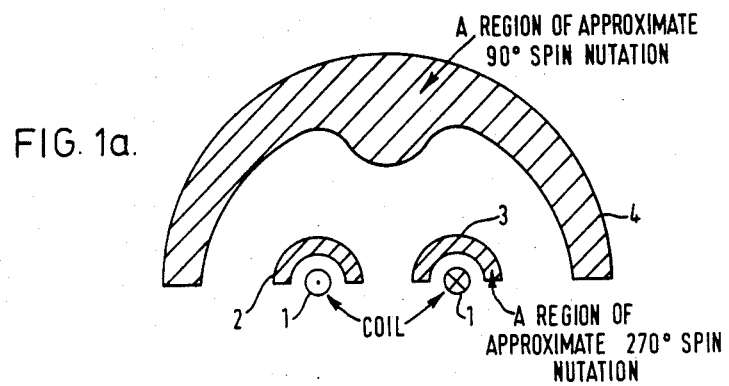
FIGS. 1a, 1b and 1c are schematic representations of the spatial response of an Rf surface coil used as a transmitter and receiver.
Figure 1B:
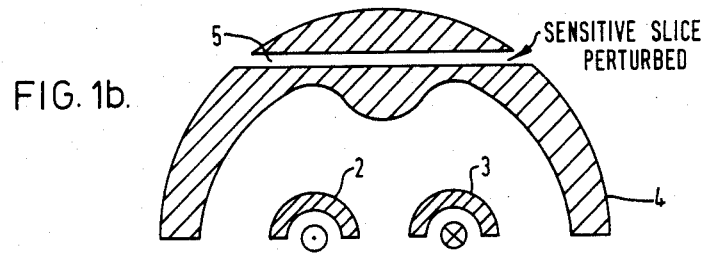
Figure 1C:
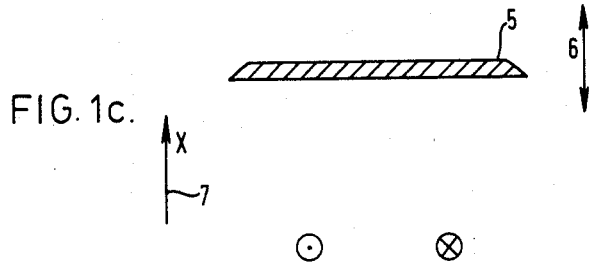

FIG. 1 is a schematic cross-section of the spatial response of a conventional surface coil 1, and FIGS. 1b and 1c illustrate how, in a field gradient orientated generally in direction X shown by the arrow 7, it is possible to obtain a spectrum due essentially only to a slice 5 of the area of field of the coil 1. When such a coil is used as a transmitter, and a high intensity pulse is applied to the coil, in the absence of a field gradient, the Rf power experienced locally in its vicinity decreases continuously with distance from the coil as shown in FIG. 1a. In a region approximately represented by the shaded area 4 (including slice 5), the power will be such as to cause substantially 90° nutation of the nuclear spins in the region. The amount of spin nutation caused will increase as the distance from the coil decreases, and in the region approximately represented by the shaded areas 2 and 3, approximately 270° nutation is observed. In a region approximately mid-way between regions 2 and 3, and 4, the spin nutation caused is approximately 180°. When such a surface coil is used as the Rf receiving antenna in an NMR experiment the signal intensity detected is at a maximum from regions 2, 3 and 4, and at a minimum from the 180° region between regions 2 and 3, and 4.

To obtain maximum signal during the spectrum acquisition part of the method, the slice of interest is subjected to an Rf pulse of intensity and duration sufficient to cause 90° spin nutation, (the signal acquisition pulse), and free induction decay is then observed. Before the application of the signal acquisition pulse, a perturbing pulse is applied according to the method of the present invention.

In FIG. 1, the Rf surface coil 1 is used as both receiving and transmitting antenna, and for clarity the perturbing pulse is also a 90° pulse. During the application of the perturbing pulse, a field gradient Gx is applied in the X direction (ie. Gx=dBz/dx, wherein Bz is the Z component of the field). Provided that the Rf pulse is of a sufficiently narrowly defined band of frequencies. resonance will be produced only in the narrow slice 5, parallel to the plane of the coil. If the intensity of the Rf pulse is such as to cause 90° nutation, the spin magnetization in the narrow slice 5 becomes effectively destroyed (i.e. the magnetization component of the slice 5 is substantially all in the X-Y plane with a zero component in the Z plane). If the intensity of the perturbing pulse is not such as to produce exactly 90° nutation, but instead is of a lesser or higher intensity, the spins in the slice 5, will have a magnetization with a residual Z component. If the spin nutation caused is from 90° to 270°, the residual Z component of the magnetization will be negative. If the Rf pulse is such as to cause spin nutation of 180°, the maximum difference in signal magnitude will be observed upon subtraction of the two signals. Thus, the preferred Rf "conditioning" pulse is such as to produce 180° spin nutation in the first region 5.

In order to obtain an NMR signal attributable to spins in the slice 5, a spectrum is taken after the spins in the slice have been perturbed, (preferably by a 180° pulse), by application of the Rf perturbing pulse in the presence of the field gradient Gx, and that spectrum is compared with a corresponding signal taken without local spin perturbation.

The spin slice 5 can be moved in the direction of the arrow 6 by variation of the zero-crossing point of the gradient Gx, or, preferably by variation of the carrier frequency of the selective Rf pulse.

Figure 2:
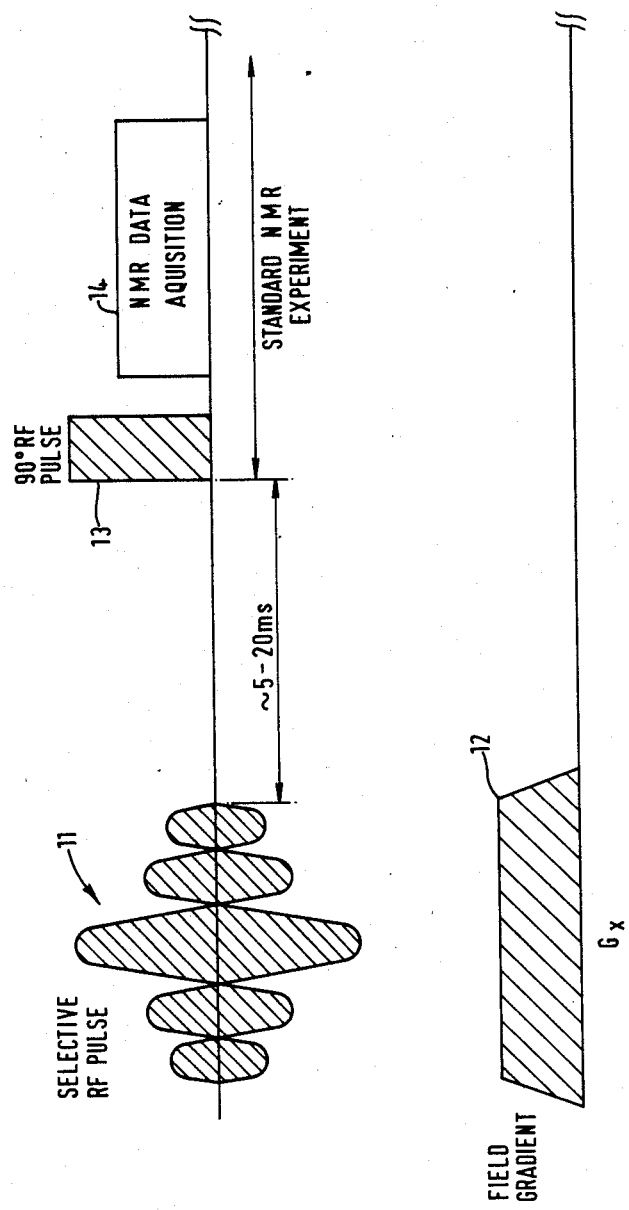
FIG. 2 is a graphical representation of the Rf fields and gradients used in a method according to the invention.

FIG. 2 shows schematically the Rf pulses and field gradients to be applied in the above method. A 90° Rf pulse 11 is applied simultaneously with a field gradient 12 in the X direction. The method is illustrated with reference to a 90° perturbing pulse 11, for clarity of reference to FIG. 1, but it should be understood that in general, a 180° perturbing pulse 11 is preferred. The pulse is applied to the surface coil 1, and effectively destroys the Z magnetization of all the spins in the slice 5 so that their contribution to the signal acquired in the subsequent signal acquisition is effectively zero. The second part of the experiment shown in FIG. 2 represents conventional NMR signal acquisition, in which a 90° Rf pulse 13 is applied, and data acquired over a period 14. The signal acquisition may take the form of a spin echo method, an imaging experiment, or any other conventional NMR technique. The NMR signal obtained is compared by a computer with a signal obtained without application of the pulse 11 and the gradient 12, so as to obtain a spectrum attributable only to spin slice 5, by a differencing technique.

In an alternative embodiment, either the conditioning pulse 11 or the acquisition pulse 13 is applied using a coil which is large in comparison with the dimensions of the surface sensing coil, so that a plane of material is excited throughout the whole sample. The surface coil limits the spatial response of the receiver to a small part of the selected plane.

Figure 3:
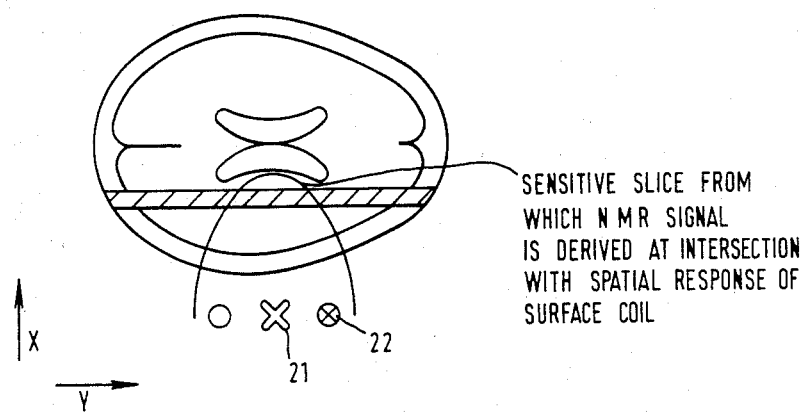
FIG. 3 is a schematic representation of an NMR experiment carried out on a human head.

FIG. 3 shows a diagramatic representation of a cross-section NMR scan of a human head. An NMR-sensitive marker 21 is utilized, which contains water, which shows up prominently in the resulting NMR image. The marker 21 takes the form of a small (2 cm) container of water having a shape which is readily recognizable (a cross), and which is fixed to a surface coil 22. The head is located inside the bore of a superconducting magnet (not shown), the field direction of which is perpendicular to the X-Y plane. The surface coil 22 is used both to apply Rf pulses 11 and 13, and as an Rf sensing coil. During the application of the Rf pulse 11, a gradient is applied in the X direction.

The position of the selected slice can be determined from a second NMR image obtained by the use of a selective 90° pre-pulse, followed by a standard NMR imaging experiment. The exact spatial response obtained by the combined use of the pre-pulse with a surface coil receiver can be imaged by a similar subtraction technique, to give an image of just the selected disc.

Figure 4:
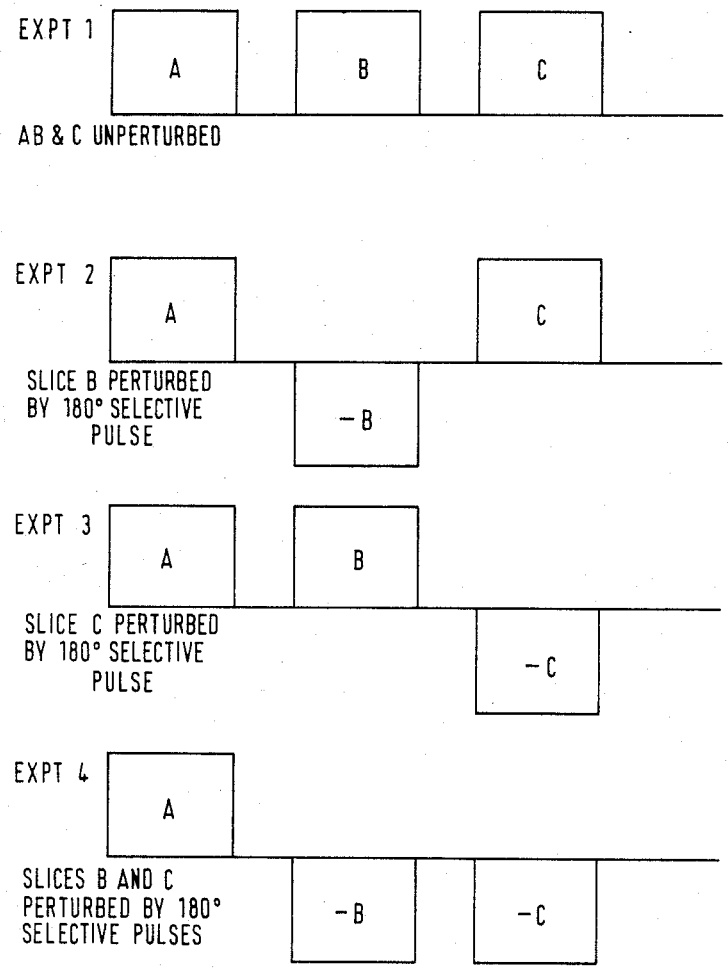
FIG. 4 is a schematic diagram of a multiple slice experiment.

FIGS. 4a to 4c illustrate schematically the spectra obtained in four successive experiments, (that is to say, the combination of application of gradient, application of conditioning pulse, release of gradient, and signal acquisition), of the kind required to enable spectra of two slices B and C, spaced along the X axis to be determined. The region designated 'A' represents the signal attributable to the remainder of the sample, (i.e. the part which does not include slices B and C.

In Experiment 1 (FIG. 4a), the standard NMR experiment is carried out, with a 90° Rf pulse only (corresponding to pulse 13 of FIG. 2), so as to excite all of the sample regions A, B and C. Thus, the signal acquired corresponds to the signal from the whole of the sample area within the ambit of the Rf coil.

In Experiment 2 (FIG. 4b), a conditioning Rf pulse is applied, in the presence of a gradient Gx, and having an intensity and frequency distribution such as to cause 180° nutation only in nuclei in a slice B. Thus the phase of the resulting NMR spectrum obtained is inverted in the region of the spectrum corresponding to slice B but in regions A and C is as in Experiment 1.

In Experiment 3 (FIG. 4c), a similar pulse is applied, but this time having a frequency such as to cause 180° nutation only in slice C, to invert the resulting NMR spectrum in the region corresponding to slice C.

In experiment 4 (FIG. 4d), 180° nutation is caused in both slices B and C, either by applying pulses as used in experiments 2 and 3 sequentially, or else by applying a combined pulse or pulse sequence, which is equivalent to the sum of the pulses of experiments 2 and 3.

The signal from slice B may then be reconstructed by using the following formula:

$$4B = (1) - (2) + (3) - (4)$$

where (1), (2), (3), and (4) are the signals acquired in experiments 1, 2, 3, and 4 respectively. Similarly, $$4C = (1) + (2) - (3) - (4)$$

By combining the results in this fashion, the only signal remaining is from the desired slice "B" or "C" respectively. Also, the signal from the slice is four times larger than in any single experiment, and thus a full-signal-to-noise ratio improvement of two is obtained.

This principle may be extended to the simultaneous observation of many more slices, without any penalty in signal-to-noise ratio. With each additional slice of information, the minimum number of signal acquisitions required is doubled. Thus eight experiments are required for three slices.

Figure 5:
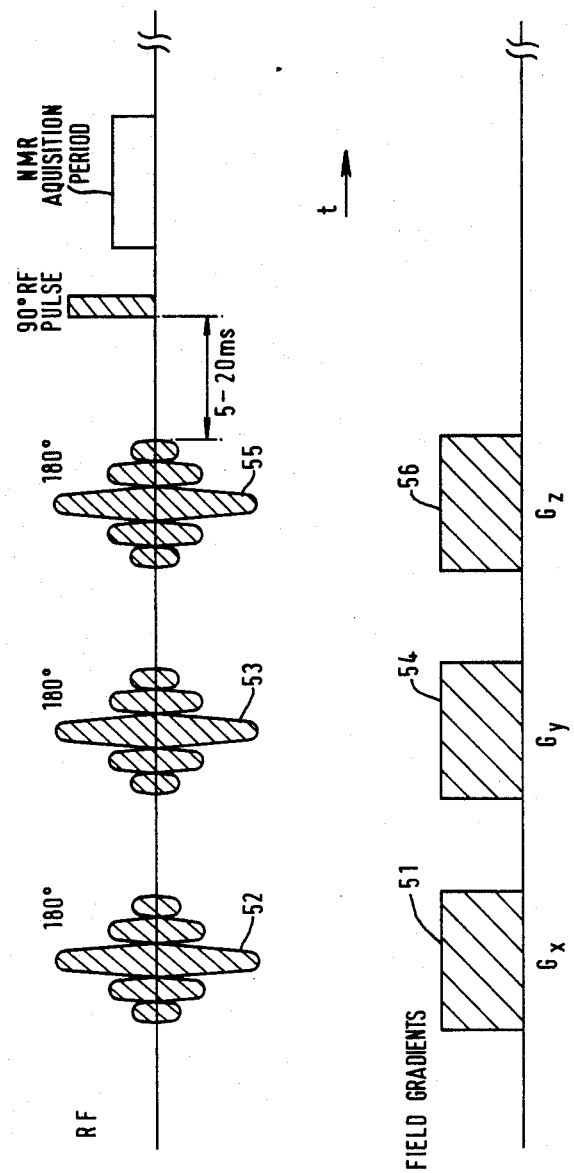
FIG. 5 is a schematic diagram of an experiment extended to localize a volumn in three dimensions.

FIG. 5 illustrates the sort of pulse sequence necessary to extend the above method into three dimensions. As shown in FIG. 5, a selective Rf conditioning pulse 52 may be applied in the presence of a field gradient Gx (51) in the X direction. Subsequently, a conditioning pulse 53 may be applied in the presence of gradient Gy (54) in the Y direction, and a conditioning pulse 55 in the presence of a gradient 56 in the Z direction.

Not all of the these pulses will always be required during the same signal acquisition, and generally to obtain the desired signal form effectively only a small cube, the following eight acquisitions or "experiments" are required.

| Experiment | Selective Pulse Power | | |
| --- | --- | --- | --- |
|  | X | Y | Z |
| (1) | OFF | OFF | OFF |
| (2) | ON | OFF | OFF |
| (3) | OFF | ON | OFF |
| (4) | ON | ON | OFF |
| (5) | OFF | OFF | ON |
| (6) | ON | OFF | ON |
| (7) | OFF | ON | ON |
| (8) | ON | ON | ON |

When the Rf pulse power is ON, the level of Rf pulse field and its time duration is sufficient to cause approximately 180° spin nutation. The errors caused by non-perfect 180° pulses cancel on completion of the sequence and combination of the sets of data. However the signal magnitude from the desired volume is maximized when the angle of the spin nutation caused by the pulses 52, 53 and 55 angle is 180°. The signal magnitude is still 60% of the maximum even if the perturbing pulses vary from 180° by as much as ±30°. The data from the individual experiments is combined according to the following formula:

Signal from
cube = (1) − (2) − (3) + (4) − (5) + (6) + (7) − (8)

As before, the signal obtained from the cube is 8x that which would have been acquired in a single experiment, and so a full increase in signal-to-noise ratio is obtained.

The position of the cube in space may be varied by appropriate adjustment of the Rf carrier frequency of the corresponding Rf pulse, or alternatively, by adjustment of the zero-crossing point of the respective gradients as described above.

When the sample under investigation includes nuclei with a relatively large chemical shift range, each component of the chemical shift spectrum will come from a slightly different cube in space and it is important to be able to determine whether this is an acceptable error bearing in mind the homogeneity of the specimen. By using two experimental sequences, one performed with all positive selection gradients, and one with all negative gradients, and subtracting the two results, we can determine whether such a spatial error will produce a significant change in the spectrum. If the specimen is homogeneous, the difference in the two signals is zero and one can deduce that the spectrum is unaffected. If the difference produces a spectrum which has any spectral components of greater than a certain proportion of the full spectrum obtained upon coaddition of the data, e.g. an error of greater than 10%, then the experiment should be repeated. The experiment which follows should therefore either define a smaller cube, or should define the same size cube more accurately, by using larger field gradients and a wide Rf frequency distribution. If the cube has been moved in position by Rf carrier frequency adjustment, the frequency change involved should be negated in all experiments using the negative field gradients, and for all directions of Rf selection within these experiments.

Hence, in a further preferred embodiment of the invention, the method is repeated with the field gradients 51, 54, 56 reversed, and the spectra obtained are compared with those obtained in the method described above with reference to FIG. 5.

Several cubes lying along a common axis may be simultaneously investigated by utilizing the method described above with reference to FIG. 4. The method may easily be extended to obtain spectra of volumes of irregular shape by addition of spectra from a suitable distribution of cubes. It will be readily apparent from the foregoing that, at its simplest, such a method may be carried out by dividing the volume of interest into the appropriate number of cubes, and performing an experiment as outlined above with reference to FIG. 5 for each of the cubes. In practice, it is not usually necessary to perform a separate series of eight acquisitions, as described above with reference to FIG. 5, for each cube into which the volume is divided.

Preferably however, spectra from several cubes lying along a common axis may instead be obtained simultaneously, by applying, in the presence of the appropriate field gradient, the necessary perturbing or "conditioning" pulse or pulses to cause the desired level of spin nutation (preferably 180°) in all the cubes on the relevant axis.

Each cube along the axis may preferably be excited separately, using a series of identical Rf pulses, by adjustment of the main Rf transmitter frequency. Thus, by extending the time required to obtain the spectrum of a cube by only a few extra Rf pulses, the spectrum of a full column of cubes may be obtained, to provide an NMR spectrum with high spatial selectivity, with only minimal loss of signal-to-noise ratio.

Thus, in order to obtain a spectrum from a volume of irregular shape, the volume is first divided into a series of cubes, which can be scanned a line at a time, by the aforementioned technique.

Figure 6:
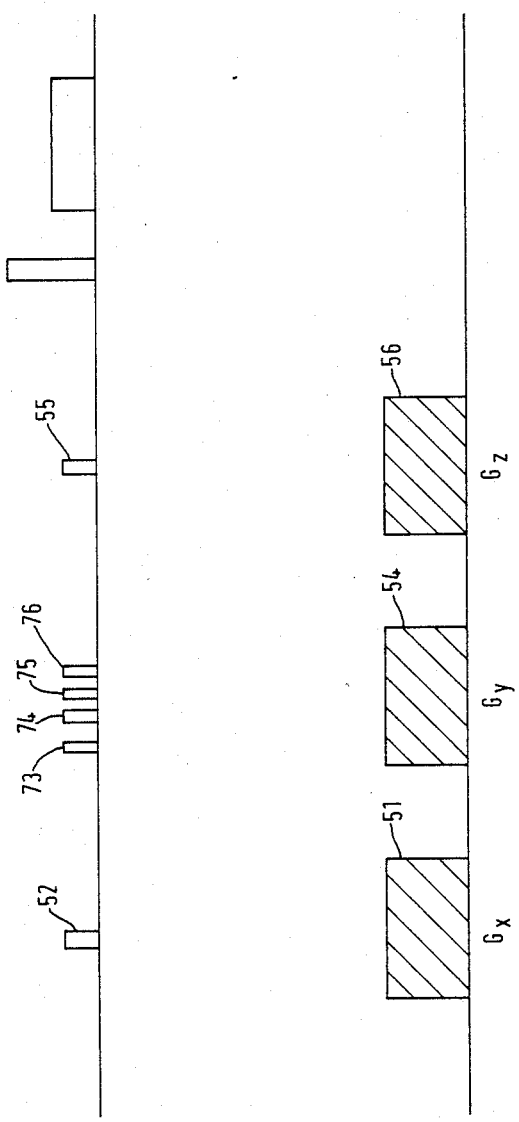
FIG. 6 illustrates an Rf pulse train.
Figure 7:
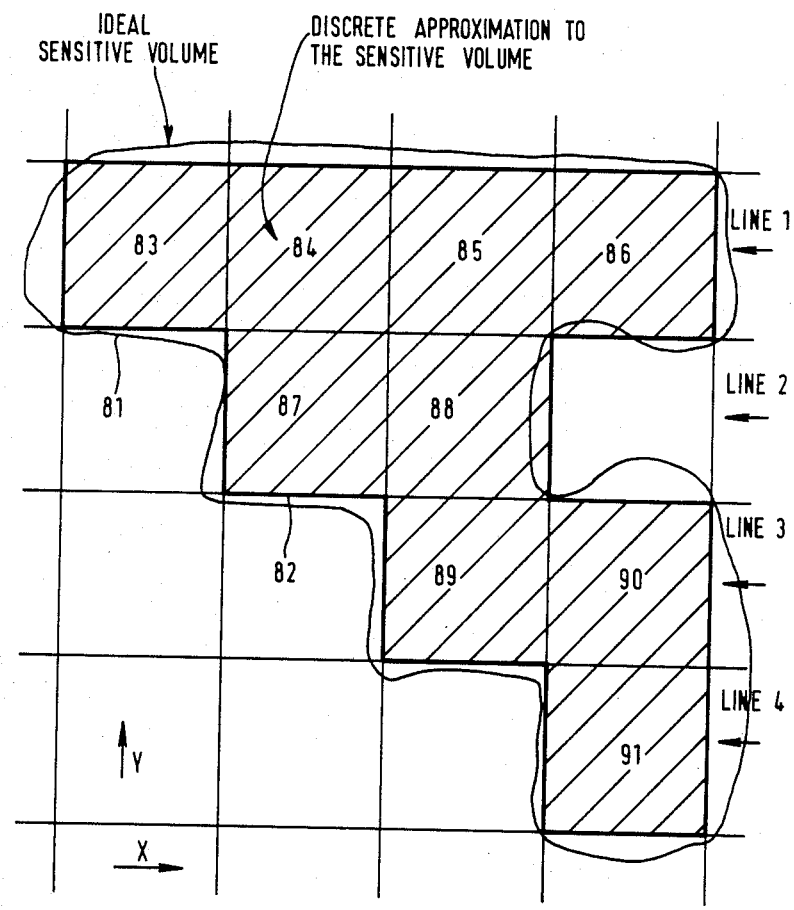
FIG. 7 illustrates how a volume can be built up from the series of smaller volumes.

FIGS. 6 and 7 illustrate how this is carried out in practice. FIG. 7 represents an irregular volume, defined by line 81, from which it is desired to obtain a spectrum. FIG. 7 illustrates the technique for two dimensions only, a slice in the X-Y plane, but it will be apparent that this technique can be extended readily into three dimensions. The volume defined by line 81 is notionally divided into nine cubes, 83 to 91. These are grouped into line 1, consisting of cubes 83 to 86, line 2, of cubes 87 and 88, line 3 of cubes 89 and 90, and line 4, containing only cube 91. FIG. 6 illustrates the pulse sequence necessary to obtain, in a single acquisition, a spectrum due to cubes 83 to 86, in line 1. In FIG. 6, Rf pulses 52 and 55, and gradients 51, 54 and 56, are as described above with reference to FIG. 5. Instead of a single Rf pulse 53 however as shown in FIG. 5, four Rf pulses 73, 74, 75, and 76 are employed, in the presence of field gradient in the X direction 54. Pulses 73 to 76 differ only in the Rf transmitter carrier frequency, and are such as to cause 180° nutation in, respectively, a column of material which includes cubes 83, 84, 85, and 86 of line 1 of FIG. 7.

Thus in the acquisition shown in FIG. 6, the spectrum obtained during signal acquisition will be inverted, for the region of the sample including to the cubes 83 to 86 of line 1. By applying a differencing technique using the signal corresponding to the spectrum of the whole sample in the scanning region of the Rf coil, the contribution to the spectrum of the cubes 83 to 86 of line 1 can be ascertained.

A similar technique is followed for each of lines 2 to 4, although, of course, the lines 2 and 3 only require two conditioning pulses in the presence of Gx gradient 54, and line 4 only requires a single pulse.

The extension to three dimensions can be carried out simply by the addition of volumes of rectangular cross-section.

Instead of using the four separate pulses 73, 74, 75, and 76 to excite the cubes 83 to 86, it is possible to use a single, suitably shaped, pulse, to excite all four cubes 83 to 86 together. A single Rf pulse employing the principle of single sideband modulation can be used for such complicated excitation patterns to define a distribution of cubes along any spatial axis.

The invention includes within its scope apparatus for carrying out the above method comprising means for applying a static magnetic field, and means for applying the necessary Rf pulses and gradients, so as to carry out the above method.

Specifically, in one aspect of the invention, there is provided apparatus for obtaining an NMR spectrum from a first region lying wholly within a second region of a sample material, which apparatus comprises means for supporting a sample in a substantially homogeneous magnetic field, means for applying to the sample a signal acquistition Rf pulse, and acquiring from the sample a first signal, indicative of the NMR spectrum of a said second region of the sample.

means for superimposing on the magnetic field a field gradient in a first direction, means for applying to the sample in the presence of the said gradient an Rf pulse having an amplitude and frequency distribution such as to perturb nuclear spins only in a said first region lying wholly within the said second region, means for acquiring from the sample a second signal, indicative of the NMR spectrum of the said second region of the sample after the application of the said Rf perturbing pulse, but in the absence of applied field gradient, and means for comparing the said first and second signals, to obtain an NMR spectrum due only to a said first region.

As indicated above, the technique is particularly suited for use on living bodies, and accordingly the sample support is preferably adapted to support a human body, with at least a portion of the body in the homogeneous region of the field. The invention also provides in a further aspect a method of diagnosing disease of the human or animal body, which method comprises obtaining an NMR spectrum from the body by a method as described above.

I claim:

1. A method of obtaining an NMR spectrum from a first region lying wholly within a second region of a sample material, which method comprises obtaining a signal indicative of a first NMR spectrum from substantially all of the second region of the sample material, applying to the sample a magnetic field gradient, and simultaneously applying to the sample an Rf perturbing pulse having an amplitude and a frequency distribution such as to perturb nuclear spins in the said first region, but not outside it, removing the magnetic field gradient, and thereafter obtaining from the sample a signal indicative of a second NMR spectrum before relaxation of the perturbed spins in the said first region, and comparing the said first and second signals to obtain a difference spectrum attributable to the said first region.

2. A method as claimed in claim 1, wherein the Rf pulse is such as to produce in the said first region spin nutation of approximately 180°.

3. A method as claimed in claim 1, wherein a surface coil is utilized as the antenna either for the Rf perturbing pulse, or for acquisition of signal to obtain the NMR spectrum, or both.

4. A method as claimed in claim 1, wherein the said method is repeated a plurality of times using different Rf pulse distributions, and the NMR spectrum of each of a plurality of said first regions is obtained by applying difference techniques to the signals obtained.

5. A method as claimed in claim 4, wherein the Rf carrier frequency is changed between subsequent repetitions, within a time period of not greater than 10 milliseconds.

6. A method as claimed in claim 1, wherein a first Rf perturbing pulse is applied in the presence of a magnetic field gradient in a first direction, a second Rf perturbing pulse is subsequently applied in the presence of a magnetic field gradient in a second direction, orthogonal to the first direction, and both gradients are removed prior to the NMR signal acquisition.

7. A method as claimed in claim 6, wherein a third Rf perturbing pulse is applied subsequently to the second Rf perturbing pulse, in the presence of a magnetic field gradient in a third direction, orthogonal to the said first and second directions, and the said third gradient is removed prior to the NMR signal acquisition.

8. Apparatus for obtaining an NMR spectrum from a first region lying wholly within a second region of a sample material, which apparatus comprises
- means for supporting a sample in a substantially homogeneous magnetic field,
- means for applying to the sample a first signal acquisition Rf pulse, and acquiring from the sample a first signal, indicative of the NMR spectrum of said second region of the sample,
- means for superimposing on the magnetic field a field gradient in a first direction,
- means for applying to the sample in the presence of the said gradient a first Rf conditioning pulse having an amplitude and frequency distribution such as to perturb nuclear spins only in said first region lying wholly within the said second region,
- means for removing the gradient and immediately thereafter applying to the sample a second signal aquisition pulse, and acquiring from the sample a second signal, indicative of the NMR spectrum of the said second region of the sample after the application of the said Rf conditioning pulse, but in the absence of applied field gradient, and
- means for comparing the said first and second signals, to obtain an NMR spectrum due only to said first region.

9. Apparatus as claimed in claim 8, including means for repeating rapidly the said sequence of Rf pluses and signal acquisition and for averaging the signals obtained from repeated acquisitions.

10. Apparatus as claimed in claim 9, including means for varying rapidly the Rf carrier frequency between successive Rf pulses.

11. Apparatus as claimed in claim 10, wherein the said means for varying the carrier frequency is capable of varying the carrier frequency and applying a further Rf pulse within a time period of not greater than 10 milliseconds.

12. Apparatus as claimed in claim 11, wherein the said period is not greater than 50 microseconds.

13. Apparatus as claimed in claim 8 including,
- means for superimposing on the magnetic field subsequently to the superimposition of the field gradient in the said first direction a magnetic field gradient in a second direction, orthogonal to the first direction, means for applying to the sample in the presence of the field gradient in the second direction a second Rf conditioning pulse having an amplitude and frequency distribution such as to perturb nuclear spins only in a third region of the said sample,
- means for acquiring from the sample in the absence of applied field gradient signals indicative of the NMR spectrum of the sample with no Rf conditioning pulse applied, after the application of the first and second Rf conditioning pulses separately, and after the application of the first and second Rf conditioning pulses together,
- and means for comparing the various signals obtained so as to derive therefrom the NMR spectrum attributable only to the overlapping portions of the said first and third regions.

14. Apparatus as claimed in claim 13, including
- means for superimposing on the magnetic field, subsequently to the superimposition of the magnetic field in the second direction, a magnetic field in a third direction, orthogonal to both the first and second directions,
- means for applying to the sample in the presence of the said gradient in the third direction a third Rf conditioning pulse having an amplitude and frequency distribution such as to perturb nuclear spins only in a fourth region,
- means for acquiring from the sample in the absence of applied field gradient signals indicative of the NMR spectrum of the sample with no Rf conditioning pulse applied, and with each of the seven possible combinations of the said first, second and third Rf conditioning pulses,
- means for comparing the signals obtained so as to derive therefrom an NMR spectrum attributable only to the overlapping portions of the said first, third and fourth regions.

15. Apparatus as claimed in claim 14, including means for applying to the sample in the presence of one of the said gradients a plurality of Rf pulses of different Rf carrier frequency, thereby to obtain on comparison of the said obtained signals, an NMR signal attributable only to nuclei in a column orientated in the direction of the said one gradient.

16. Apparatus as claimed in claim 15, including means for obtaining a signal indicative of an NMR spectrum from a plurality of regions or columns of the object, and for summing the said signals, so as to obtain an NMR spectrum of a region of the object composed of a plurality of said samll regions or columns.

17. Apparatus as claimed in claim 8, wherein the means for supporting the sample includes means for supporting a human body with at least a portion of the body in the said homogeneous region of the magnetic field.

* * * * *